United States Patent
Kang

(10) Patent No.: US 9,467,155 B2
(45) Date of Patent: Oct. 11, 2016

(54) PHASE-LOCKED LOOP CIRCUIT INCLUDING VOLTAGE DOWN CONVERTER CONSISTING OF PASSIVE ELEMENT

(71) Applicant: SAMSUNG ELECTRONICS CO., LTD., Suwon-si, Gyeonggi-do (KR)

(72) Inventor: Heechai Kang, Suwon-si (KR)

(73) Assignee: SAMSUNG ELECTRONICS CO., LTD., Suwon-Si, Gyeonggi-do (KR)

(*) Notice: Subject to any disclaimer, the term of this patent is extended or adjusted under 35 U.S.C. 154(b) by 0 days.

(21) Appl. No.: 14/635,252

(22) Filed: Mar. 2, 2015

(65) Prior Publication Data

US 2015/0256188 A1    Sep. 10, 2015

(30) Foreign Application Priority Data

Mar. 4, 2014  (KR) .......................... 10-2014-0025302

(51) Int. Cl.
*H03L 7/099*    (2006.01)
*H03L 7/08*     (2006.01)

(52) U.S. Cl.
CPC ............ *H03L 7/099* (2013.01); *H03L 7/0802* (2013.01)

(58) Field of Classification Search
CPC .. H03K 21/00; H03K 21/12; H03K 5/00006; H03K 2005/00293; H03L 7/0802; H03L 7/09; H03L 7/0995; H03L 7/16; H03L 7/185
USPC ......... 327/156, 158, 161; 375/374, 375, 376
See application file for complete search history.

(56) References Cited

U.S. PATENT DOCUMENTS

| | | | |
|---|---|---|---|
| 5,864,258 A | 1/1999 | Cusinato et al. | |
| 6,016,332 A | 1/2000 | Smith et al. | |
| 7,973,612 B2 | 7/2011 | Raghunathan et al. | |
| 8,362,848 B2 | 1/2013 | Raghunathan et al. | |
| 8,373,460 B2 | 2/2013 | Sinha et al. | |
| 8,378,723 B1 | 2/2013 | Atesoglu | |
| 8,378,725 B2 | 2/2013 | Thakur et al. | |
| 8,487,677 B1 | 7/2013 | Xue | |
| 2007/0159264 A1 | 7/2007 | Jung et al. | |
| 2011/0006819 A1* | 1/2011 | Bazes ............... | H03K 3/356113 327/156 |
| 2012/0242384 A1* | 9/2012 | Kato ....................... | H03L 7/097 327/157 |

FOREIGN PATENT DOCUMENTS

JP    2013-017037    1/2013
KR    10-2007-0053982 A    5/2007

* cited by examiner

*Primary Examiner* — John Poos
(74) *Attorney, Agent, or Firm* — Lee & Morse, P.C.

(57) ABSTRACT

A phase-locked loop circuit includes a first circuit, a second circuit, and a voltage down converter. The first circuit generates a first signal based on a reference signal and a feedback signal, and operates based on a first supply voltage. The second circuit generates an oscillation signal based on a second signal, generates the feedback signal by dividing the oscillation signal, and operates based on a second supply voltage lower than the first supply voltage. The voltage down converter generates the second signal by decreasing an activation voltage level of the first signal. The voltage down converter includes at least one passive element electrically connected between the first circuit and the second circuit.

18 Claims, 10 Drawing Sheets

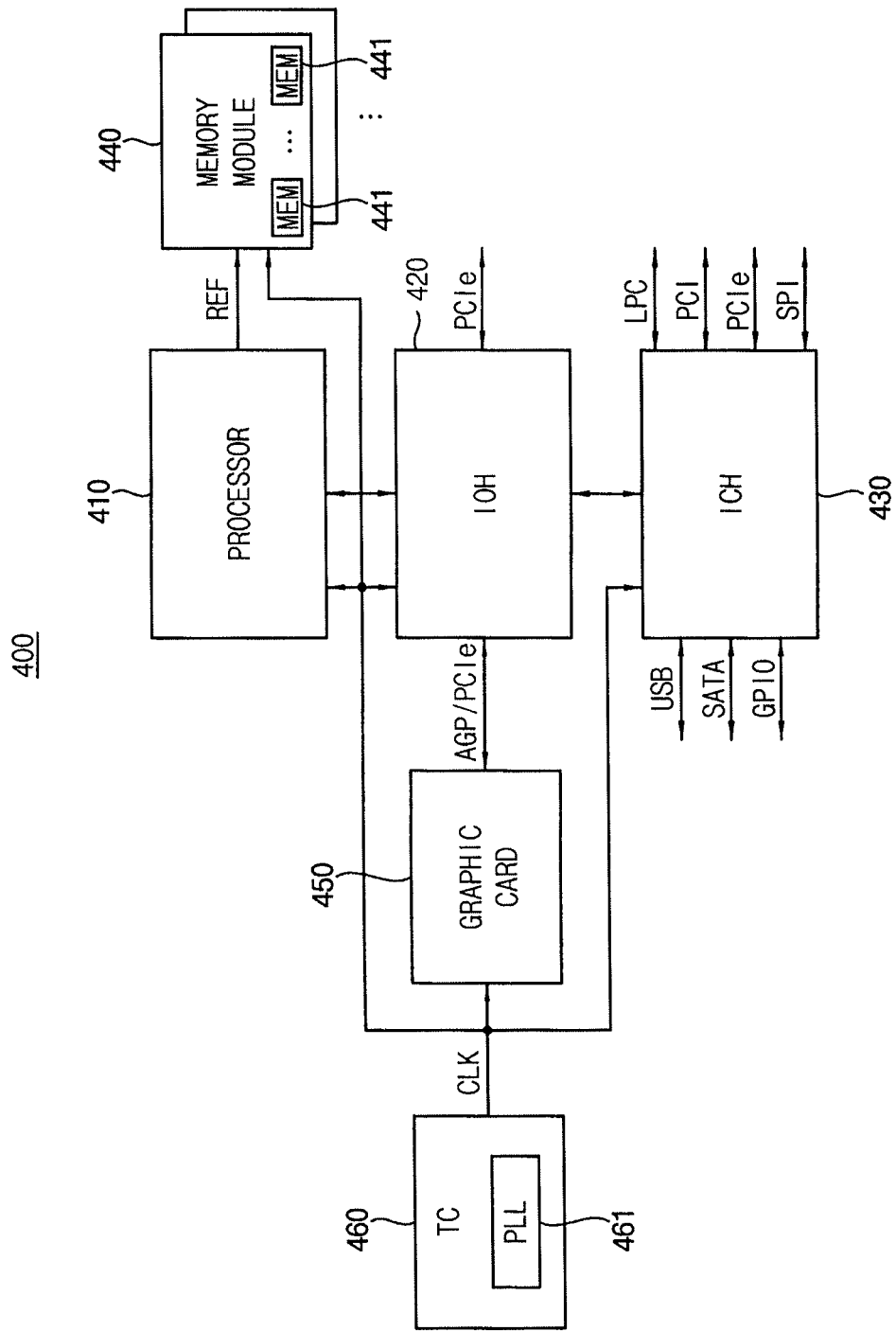

PHASE-LOCKED LOOP CIRCUIT INCLUDING VOLTAGE DOWN CONVERTER CONSISTING OF PASSIVE ELEMENT

CROSS-REFERENCE TO RELATED APPLICATION

Korean Patent Application No. 10-2014-0025302, filed on Mar. 4, 2014, and entitled, "Phase-Locked Loop Circuit including Voltage Down Converter Consisting of Passive Element," is incorporated by reference herein in its entirety.

BACKGROUND

1. Field

One or more embodiments described herein relate to a phase-locked loop circuit.

2. Discussion of the Related Art

It is difficult to secure voltage head room in designing an analog circuit with a deep sub-micron manufacturing process. This is because a deep sub-micron manufacturing process provides low supply voltage and relatively high threshold voltage. Analog circuits have been used in a variety of applications.

An analog circuit in a phase-locked loop circuit has been developed using a thick oxide transistor, which operates based on higher supply voltage. In contrast, a digital circuit in a phase-locked loop circuit may be implemented using a thin oxide transistor in a reduced area.

When an analog circuit is used in the phase-locked loop circuit, the analog circuit may include a voltage controlled oscillator (VCO) delay cell. The VCO delay cell may be implemented by a thin oxide transistor to generate a signal in the GHz frequency range, even though the VCO delay cell is a sort of analog circuit. In operation, the VCO delay cell may be physically destroyed by various factors, including but not limited to a relatively high voltage signal generated by the analog circuit.

SUMMARY

In accordance with one embodiment, a phase-locked loop circuit includes a first circuit to generate a first signal based a reference signal and a feedback signal, the first circuit to operate based on a first supply voltage; a second circuit to generate an oscillation signal based on a second signal and to generate the feedback signal by dividing the oscillation signal, the second circuit to operate based on a second supply voltage lower than the first supply voltage; and a voltage down converter to generate the second signal by decreasing an activation voltage level of the first signal, wherein the voltage down converter includes at least one passive element electrically connected between the first circuit and the second circuit.

The at least one passive element may be a resistor. The at least one passive element may include one or more transistors, and gate terminals of the one or more transistors may be coupled to receive a fixed voltage. The one or more transistors may be connected in series between an output node of the first circuit and an input node of the second circuit. The one or more transistors are connected in parallel between an output node of the first circuit and an input node of the second circuit.

The at least one passive element may include a plurality of transistors, wherein voltage levels of gate terminals of the transistors are controlled so that an activation voltage level of the second signal is substantially equal to a voltage level of the second supply voltage. The voltage down converter may include a controller to generate control signals for controlling voltage levels of the gate terminals of the transistors.

The first circuit may include a voltage up converter to generate an increased reference signal and an increased feedback signal, by increasing activation voltage levels of the reference signal and the feedback signal; a phase/frequency detector to generate a pulse signal based on a comparison of the increased reference signal and the increased feedback signal; a pulse/voltage converter to generate a voltage signal corresponding to the pulse signal; and a regulator to generate the first signal having a regulated activation voltage level by regulating the voltage signal.

The pulse/voltage converter may include a loop filter to generate the voltage signal based on stored charge; and a charge pump to add charge to the stored charge or subtract charge from the stored charge based on the pulse signal.

The regulator may include a transistor and an operational amplifier, wherein a negative input node of the operational amplifier is to receive the voltage signal, an output node of the operational amplifier is electrically connected to a gate terminal of the transistor, the first supply voltage is to be provided to a source terminal of the transistor, an output node of the first circuit is electrically connected to a positive input node of the operational amplifier and a drain terminal of the transistor, and the first signal is to be output through the output node of the first circuit. The voltage up converter may include a level shifter.

The second circuit may include an oscillator to generate the oscillation signal based on the second signal, which is received through an input node of the second circuit; and a divider to generate the feedback signal by dividing the oscillation signal.

In accordance with another embodiment, a phase-locked loop circuit includes a first circuit, a second circuit, and a voltage down converter. The first circuit includes a voltage up converter to generate an increased reference signal and an increased feedback signal by increasing activation voltage levels of a reference signal and a feedback signal; a phase/frequency detector to generate a pulse signal based on a comparison of the increased reference signal and the increased feedback signal, a pulse/voltage converter to generate a voltage signal based on the pulse signal, and a regulator to generate a first signal having a regulated activation voltage level by regulating the voltage signal.

The second circuit includes an oscillator to generate an oscillation signal based on a second signal, and a divider to generate the feedback signal by dividing the oscillation signal.

The voltage down converter generates the second signal by decreasing the regulated activation voltage level of the first signal. The voltage down converter includes a passive element between the first circuit and the second circuit, and the first circuit operates based on a first supply voltage and the second circuit operates based on a second supply voltage lower than the first supply voltage.

In accordance with another embodiment, a phase-locked loop circuit includes a first circuit to generate a first signal based on a comparison between a reference signal and a feedback signal; a second circuit to generate the feedback signal based on the first signal; and a passive circuit between first and second circuits, wherein the passive circuit is to decrease an activation voltage level of the first signal, and wherein the first and second circuits operate are based different power supply voltages.

The first circuit may operate based on a first power supply voltage, and the second circuit may operate based on a second power supply voltage less than the first power supply voltage. The activation voltage level of the first signal may be substantially equal to the first power supply voltage, and the passive circuit may decrease the activation voltage level of the first signal to an activation voltage level which corresponds to second power supply voltage.

A signal output from the passive circuit may have a voltage based on a resistance of the passive circuit. The passive circuit may include at least one three-terminal device operating in a passive mode. The second circuit may include a voltage-controlled oscillator delay cell to output an oscillation signal based on a signal output from the passive circuit. The first circuit may be coupled to the second circuit through the passive circuit, and wherein an active circuit is not coupled along a signal path along which the first signal is carried between the first and second circuits.

BRIEF DESCRIPTION OF THE DRAWINGS

Features will become apparent to those of skill in the art by describing in detail exemplary embodiments with reference to the attached drawings in which:

FIG. 12 illustrates an embodiment of a computing system.

DETAILED DESCRIPTION

Figure 1:
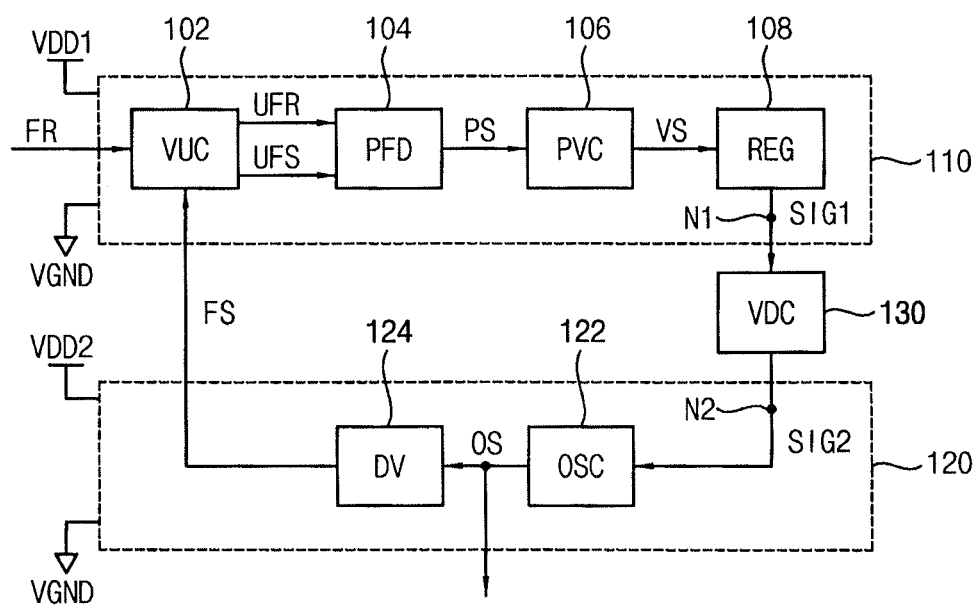
FIG. 1 illustrates an embodiment of a phase-locked loop circuit.

Example embodiments are described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art. In the drawings, the dimensions of layers and regions may be exaggerated for clarity of illustration. Like reference numerals refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

FIG. 1 illustrates an embodiment of a phase-locked loop circuit 100 which includes a first circuit 110, a second circuit 120, and a voltage down converter VDC 130. The first circuit 110 generates a first signal SIG1 based a reference signal FR and a feedback signal FS. The first circuit 110 operates based on a first supply voltage VDD1.

The second circuit 120 generates an oscillation signal OS based on a second signal SIG2. The second circuit 120 generates the feedback signal FS by dividing the oscillation signal OS. The second circuit 120 operates based on a second supply voltage VDD2, which may have a lower voltage level than the first supply voltage VDD1.

The voltage down converter VDC 130 generates the second signal SIG2 by decreasing an activation voltage level of the first signal SIG1. The voltage down converter VDC 130 may consist of a passive element or may include one or more passive elements. The first circuit 110 and the second circuit 120 are electrically connected through the voltage down converter VDC 130.

The first signal SIG1 may have different voltages at different times. The first signal SIG1 may have a deactivation voltage based on a ground voltage VGND at one time. The first signal SIG1 may have an activation voltage based on the first supply voltage VDD1 at another time. A voltage level of the deactivation voltage of the first signal SIG1 may be 0 V. A voltage level of the activation voltage of the first signal SIG1 may be a voltage level of the first supply voltage VDD1.

The second signal SIG2 may also have different voltages at different times. The second signal SIG2 may have a deactivation voltage based on the ground voltage VGND at one time. The second signal SIG2 may have an activation voltage based on the second supply voltage VDD2 at another time. A voltage level of the deactivation voltage of the second signal SIG2 may be 0 V. A voltage level of the activation voltage of the second signal SIG2 may be a voltage level of the second supply voltage VDD2.

The second circuit 120 may generate the oscillation signal OS as a clock signal. In accordance with one embodiment, a passive element may refer to an electrical device that does not amplify or oscillate a signal, because the passive element does not use an external supply voltage. Examples of the passive elements include a resistor or a capacitor.

A transistor may be classified as an active element, at least for some applications, because a transistor may be used to amplify or oscillate a signal based on an external supply voltage. In accordance with one embodiment, a transistor having a gate terminal that receives a certain fixed voltage may operate as a passive element. This is because a transistor may be substituted with an equivalent circuit including resistors and capacitors, when the certain fixed voltage is provided to a gate terminal of the transistor and source/drain terminals of the transistor are used as input/output nodes.

The first circuit 110 may include a voltage up converter VUC 102, a phase/frequency detector PFD 104, a pulse/voltage converter PVC 106, and a regulator REG 108. The voltage up converter VUC 102 may generate an increased reference signal UFR and an increased feedback signal UFS by increasing activation voltage levels of the reference signal FR and the feedback signal FS. In one embodiment, the voltage up converter VUC 102 may include a level shifter.

The phase/frequency detector PFD 104 may generate a pulse signal PS by comparing the increased reference signal UFR and the increased feedback signal UFS. For example, the phase/frequency detector PFD 104 may generate the pulse signal PS by subtracting a voltage level of the increased feedback signal UFS from a voltage level of the increased reference signal UFR.

The pulse/voltage converter PVC 106 may generate a voltage signal VS corresponding to the pulse signal PS.

The regulator REG 108 may generate the first signal SIG1 having a regulated activation voltage level by regulating the voltage signal VS.

The second circuit 120 may include an oscillator OSC 122 and a divider DV 124. The oscillator OSC 122 may generate the oscillation signal OS based on the second signal SIG2, which is received from an input node N2 of the second circuit 120. The divider DV 124 may generate the feedback signal FS by dividing the oscillation signal OS.

Figure 2:
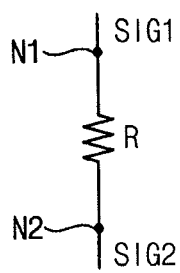
FIGS. 2-8 illustrate embodiments of a voltage down converter.

FIGS. 2 through 8 illustrate embodiments of the voltage down converter VDC 130 in FIG. 1. Referring to FIG. 2, one embodiment of the voltage down converter VDCa may consist of a resistor R. A terminal of the resistor R may be electrically connected to the output node N1 of the first circuit 110. Another terminal of the resistor R may be electrically connected to the input node N2 of the second circuit 120. In another embodiment, the voltage down converter VDCa may include a plurality of passive elements.

The first signal SIG1 and the second signal SIG2 may have the same logical signal values, but different activation voltage levels. In operation, the resistor R may decrease an activation voltage level of the first signal SIG1, which may be the same as a voltage level of the first supply voltage VDD1, to an activation voltage level of the second signal SIG2, which may be the same as a voltage level of the second supply voltage VDD2.

Figure 3:
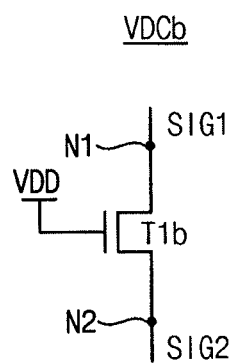

Referring to FIG. 3, another embodiment of the voltage down converter VDCb consists of a passive element in the form of an NMOS transistor T1$b$. A certain fixed voltage may be provided to a gate terminal of the NMOS transistor T1$b$. The certain fixed voltage may be, for example, a supply voltage VDD which turns on the NMOS transistor T1$b$. In this embodiment, the NMOS transistor T1$b$ has a gate terminal electrically connected to the supply voltage VDD and operates as a resistor. A source terminal of the NMOS transistor T1$b$ is electrically connected to the output node N1 of the first circuit 110. A drain terminal of the NMOS transistor T1$b$ is electrically connected to the input node N2 of the second circuit 120. In another embodiment, the voltage down converter VDCb may include a plurality of passive elements.

In operation, the NMOS transistor T1$b$ may decrease the activation voltage level of the first signal SIG1, which may be the same as the voltage level of the first supply voltage VDD1, to the activation voltage level of the second signal SIG2, which may be the same as the voltage level of the second supply voltage VDD2.

Figure 4A:
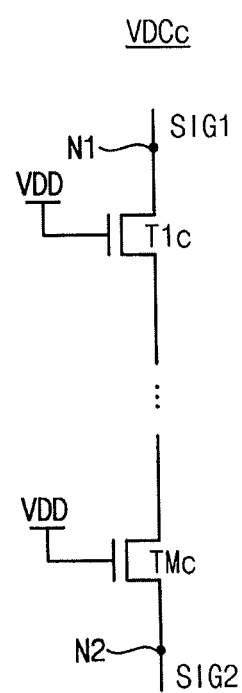

Referring to FIG. 4A, another embodiment of the voltage down converter VDCc may consist of a passive element or may include a plurality of NMOS transistors T1$c$ through TMc. In the case where the voltage down converter VDCc includes a plurality of NMOS transistors T1$c$ through TMc, the output node N1 of the first circuit 110 and the input node N2 of the second circuit 120 may be connected through the NMOS transistors T1$c$ through TMc. The NMOS transistors T1$c$ through TMc may be electrically connected in series. Gates of the NMOS transistors T1$c$ through TMc may receive a certain fixed voltage. The certain fixed voltage may be, for example, the supply voltage VDD which turns on the NMOS transistors T1$c$ through TMc.

The NMOS transistors T1$c$ through TMc have gate terminals electrically connected to the supply voltage VDD and operate as resistors. A source terminal of the first NMOS transistor T1$c$ may be electrically connected to the output node N1 of the first circuit 110. A drain terminal of the first NMOS transistor T1$c$ may be electrically connected to a source terminal of the second NMOS transistor. A source terminal of the (M)-th NMOS transistor TMc may be electrically connected to a drain terminal of the (M−1)th NMOS transistor. A drain terminal of the (M)-th NMOS transistor TMc may be electrically connected to the input node N2 of the second circuit 120.

In operation, the NMOS transistors T1$c$ through TMc may decrease the activation voltage level of the first signal SIG1, which is the same as the voltage level of the first supply voltage VDD1, to the activation voltage level of the second signal SIG2, which is the same as the voltage level of the second supply voltage VDD2.

Figure 4B:
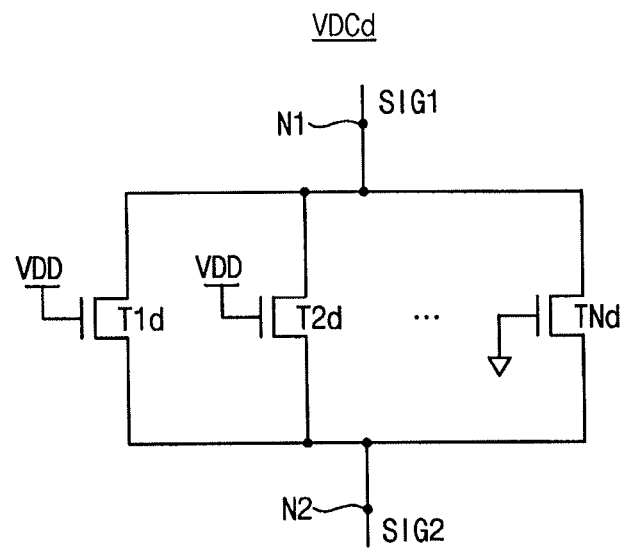

Referring to FIG. 4B, another embodiment of the voltage down converter VDCd may consist of a passive element or may include a plurality of NMOS transistors T1$d$, T2$d$ through TNd. In the case where the voltage down converter VDCd includes a plurality of NMOS transistors T1$d$, T2$d$ through TNd, the output node N1 of the first circuit 110 and the input node N2 of the second circuit 120 may be connected through the NMOS transistors T1$d$, T2$d$ through TNd. The NMOS transistors T1$d$, T2$d$ through TNd may be electrically connected in parallel.

Gates of the NMOS transistors T1$d$, T2$d$ through TNd may receive certain fixed voltages respectively. The certain fixed voltage may be the supply voltage VDD which turns on the NMOS transistors T1$d$, T2$d$ through TNd. The certain fixed voltage may be the ground voltage VGND which turns off the NMOS transistors T1$d$, T2$d$ through TNd.

The NMOS transistors T1$d$ and T2$d$ have gate terminals electrically connected to the supply voltage VDD and operate as resistors. The (N)-th NMOS transistor TNd have gate terminals electrically connected to the ground voltage VGND and operate as open-circuits.

A source terminal of the first NMOS transistor T1$d$ may be electrically connected to the output node N1 of the first circuit 110. A source terminal of the second NMOS transistor T2$d$ may be electrically connected to the output node N1 of the first circuit 110. A source terminal of the (N)-th NMOS transistor TNd may be electrically connected to the output node N1 of the first circuit 110. A drain terminal of the first NMOS transistor T1$d$ may be electrically connected to the input node N2 of the second circuit 120. A drain terminal of the second NMOS transistor T2$d$ may be electrically connected to the input node N2 of the second circuit 120. A drain terminal of the (N)-th NMOS transistor TNd may be electrically connected to the input node N2 of the second circuit 120.

In operation, the NMOS transistors T1$d$, T2$d$ through TNd may decrease the activation voltage level of the first signal SIG1, which is the same as the voltage level of the first supply voltage VDD1, to the activation voltage level of the second signal SIG2, which is the same as the voltage level of the second supply voltage VDD2.

Figure 4C:
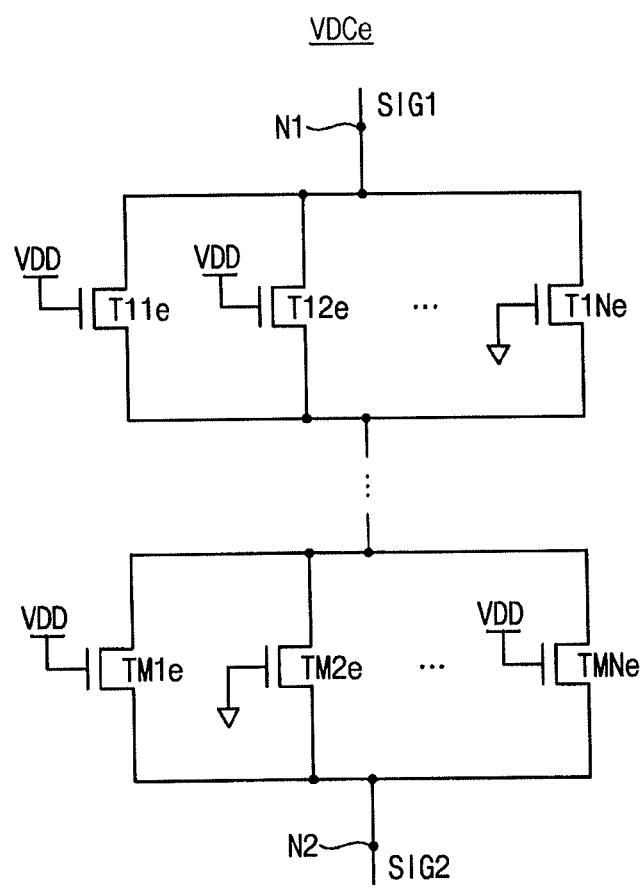

Referring to FIG. 4C, another embodiment of the voltage down converter VDCe may consist of a passive element or may include a plurality of NMOS transistors T11$e$, T12$e$ through T1Ne, TM1$e$, TM2$e$ through TMNe. In the case where the voltage down converter VDCe includes a plurality of NMOS transistors T11$e$, T12$e$ through T1Ne, TM1$e$, TM2$e$ through TMNe, certain fixed voltages may be provided to gate terminals of the NMOS transistors T11$e$, T12$e$ through T1Ne, TM1$e$, TM2$e$ through TMNe, respectively. The certain fixed voltage may be the supply voltage VDD which turns on the NMOS transistors T11$e$, T12$e$ through T1Ne, TM1$e$, TM2$e$ through TMNe. The certain fixed voltage may be the ground voltage VGND which turns off the NMOS transistors T11$e$, T12$e$ through T1Ne, TM1$e$, TM2$e$ through TMNe.

The NMOS transistors T11$e$, T12$e$, TM1$e$, and TMNe have gate terminals electrically connected to the supply voltage VDD and operate as resistors. The NMOS transistors T1Ne and TM2e have gate terminals electrically connected to the ground voltage VGND and operate as open-circuits.

A source terminal of the (1, 1)-th NMOS transistor T11e may be electrically connected to the output node N1 of the first circuit 110. A source terminal of the (1, 2)-th NMOS transistor T12e may be electrically connected to the output node N1 of the first circuit 110.

A source terminal of the (1, N)-th NMOS transistor T1Ne may be electrically connected to the output node of the first circuit 110. A drain terminal of the (1, 1)-th NMOS transistor T11e, a drain terminal of the (1, 2)-th NMOS transistor T12e, and a drain terminal of the (1, N)-th NMOS transistor T1Ne may be electrically connected to a source terminal of the (2, 1)-th NMOS transistor, a source terminal of the (2, 2)-th NMOS transistor, and a source terminal of the (2, N)-th NMOS transistor.

A drain terminal of the (M–1, 1)-th NMOS transistor, a drain terminal of the (M–1, 2)-th NMOS transistor, and a drain terminal of the (M–1, N)-th NMOS transistor may be electrically connected to a source terminal of the (M, 1)-th NMOS transistor TM1e, a source terminal of the (M, 2)-th NMOS transistor TM2e, and a source terminal of the (M, N)-th NMOS transistor TMNe.

A drain terminal of the (M, 1)-th NMOS transistor TM1e may be electrically connected to the input node N2 of the second circuit 120. A drain terminal of the (M, 2)-th NMOS transistor TM2e may be electrically connected to the input node N2 of the second circuit 120. A drain terminal of the (M, N)-th NMOS transistor TMNe may be electrically connected to the input node N2 of the second circuit 120.

In operation, the NMOS transistors T11e, T12e through T1Ne, TM1e, TM2e through TMNe may decrease the activation voltage level of the first signal SIG1, which may be the same as the voltage level of the first supply voltage VDD1, to the activation voltage level of the second signal SIG2, which may be the same as the voltage level of the second supply voltage VDD2.

Figure 5:
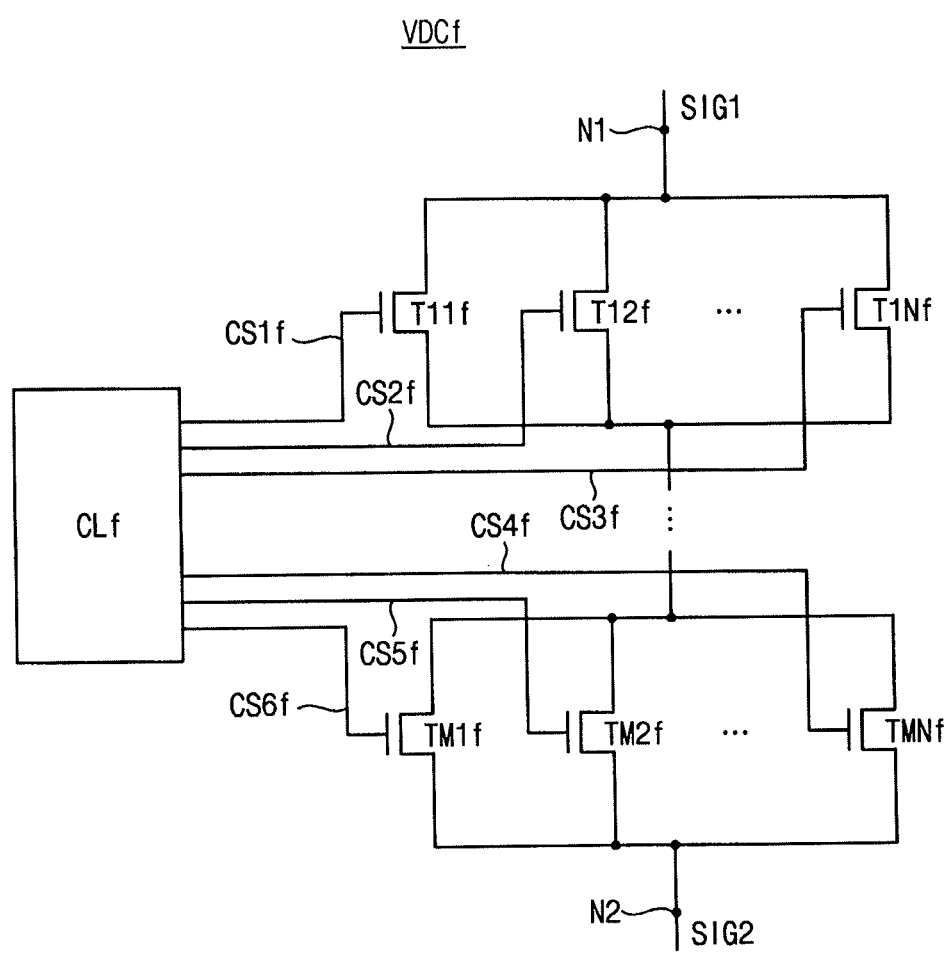

Referring to FIG. 5, another embodiment of the voltage down converter VDCf may consist of a passive element or may include a plurality of NMOS transistors T11f, T12f through T1Nf, TM1f, TM2f through TMNf, and a controller CLf. In this latter case, the controller CLf may provide control signals CS1f, CS2f, CS3f, CS4f, CS5f, and CS6f to gate terminals of the NMOS transistors T11f, T12f through T1Nf, TM1f, TM2f through TMNf, respectively. The control signals CS1f, CS2f, CS3f, CS4f, CS5f, and CS6f may have the supply voltage VDD, which may turn on the NMOS transistors T11f, T12f through T1Nf, TM1f, TM2f through TMNf respectively, or may have the ground voltage VGND which may turn off the NMOS transistors T11f, T12f through T1Nf, TM1f, TM2f through TMNf respectively.

The control signals CS1f, CS2f, CS3f, CS4f, CS5f, and CS6f may be fixed to the supply voltage VDD or the ground voltage VGND when the phase-locked loop circuit 100 is operating.

A source terminal of the (1, 1)-th NMOS transistor T11f may be electrically connected to the output node N1 of the first circuit 110. A source terminal of the (1, 2)-th NMOS transistor T12f may be electrically connected to the output node N1 of the first circuit 110.

A source terminal of the (1, N)-th NMOS transistor T1Nf may be electrically connected to the output node of the first circuit 110. A drain terminal of the (1, 1)-th NMOS transistor T11f, a drain terminal of the (1, 2)-th NMOS transistor T12f, and a drain terminal of the (1, N)-th NMOS transistor T1Nf may be electrically connected to a source terminal of the (2, 1)-th NMOS transistor, a source terminal of the (2, 2)-th NMOS transistor, and a source terminal of the (2, N)-th NMOS transistor.

A drain terminal of the (M–1, 1)-th NMOS transistor, a drain terminal of the (M–1, 2)-th NMOS transistor, and a drain terminal of the (M–1, N)-th NMOS transistor may be electrically connected to a source terminal of the (M, 1)-th NMOS transistor TM1f, a source terminal of the (M, 2)-th NMOS transistor TM2f, and a source terminal of the (M, N)-th NMOS transistor TMNf.

A drain terminal of the (M, 1)-th NMOS transistor TM1f may be electrically connected to the input node N2 of the second circuit 120.

A drain terminal of the (M, 2)-th NMOS transistor TM2f may be electrically connected to the input node N2 of the second circuit 120.

A drain terminal of the (M, N)-th NMOS transistor TMNf may be electrically connected to the input node N2 of the second circuit 120.

In operation, the NMOS transistors T11f, T12f through T1Nf, TM1f, TM2f through TMNf may decrease the activation voltage level of the first signal SIG1, which may be the same as the voltage level of the first supply voltage VDD1, to the activation voltage level of the second signal SIG2, which may be the same as the voltage level of the second supply voltage VDD2.

Figure 6:
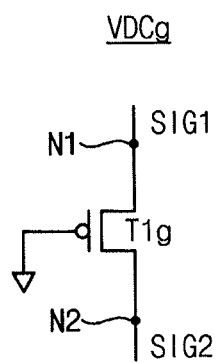

Referring to FIG. 6, another embodiment of the voltage down converter VDCg may consist of a PMOS transistor T1g. A certain fixed voltage may be provided to a gate terminal of the PMOS transistor T1g. The certain fixed voltage may be the ground voltage VGND which turns on the PMOS transistor T1g.

The PMOS transistor T1g has a gate terminal electrically connected to the ground voltage VGND and operates as a resistor. A source terminal of the PMOS transistor T1g is electrically connected to the output node N1 of the first circuit 110, and a drain terminal of the PMOS transistor T1g is electrically connected to the input node N2 of the second circuit 120.

In operation, the PMOS transistor T1g may decrease the activation voltage level of the first signal SIG1, which may be the same as the voltage level of the first supply voltage VDD1, to the activation voltage level of the second signal SIG2, which may be the same as the voltage level of the second supply voltage VDD2.

Figure 7A:
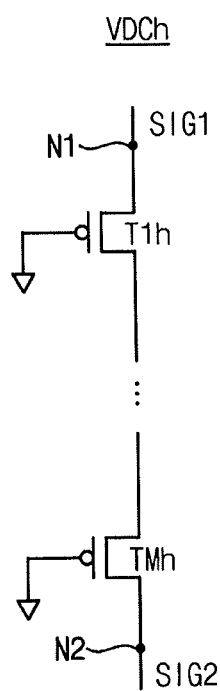

Referring to FIG. 7A, another embodiment of the voltage down converter VDCh may consist of a passive element that includes a plurality of PMOS transistors T1h through TMh. In this case, the output node N1 of the first circuit 110 and the input node N2 of the second circuit 120 may be connected through the PMOS transistors T1h through TMh. The PMOS transistors T1h through TMh may be electrically connected in series. Gates of the PMOS transistors T1h through TMh may receive a certain fixed voltage. The certain fixed voltage may be the ground voltage VGND which turn on the PMOS transistors T1h through TMh.

The PMOS transistors T1h through TMh have gate terminals electrically connected to the ground voltage VGND and operate as resistors. A source terminal of the first PMOS transistor T1h may be electrically connected to the output node N1 of the first circuit 110. A drain terminal of the first PMOS transistor T1h may be electrically connected to a source terminal of the second PMOS transistor.

A source terminal of the (M)-th PMOS transistor TMh may be electrically connected to a drain terminal of the (M–1)th PMOS transistor. A drain terminal of the (M)-th PMOS transistor TMh may be electrically connected to the input node N2 of the second circuit 120.

In operation, the PMOS transistors T1h through TMh may decrease the activation voltage level of the first signal SIG1, which may be the same as the voltage level of the first supply voltage VDD1, to the activation voltage level of the second signal SIG2, which may be the same as the voltage level of the second supply voltage VDD2.

Figure 7B:
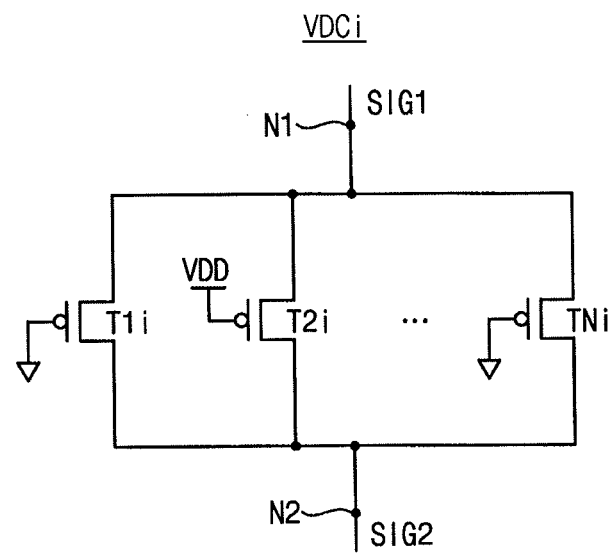

Referring to FIG. 7B, another embodiment of the voltage down converter VDCi may consist of a passive element that includes a plurality of PMOS transistors T1i, T2di through TNi. The output node N1 of the first circuit 110 and the input node N2 of the second circuit 120 may be connected through the PMOS transistors T1i, T2i through TNi. The PMOS transistors T1i, T2i through TNi may be electrically connected in parallel.

Gates of the PMOS transistors T1i, T2i through TNi may receive a certain fixed voltage. The certain fixed voltage may be the ground voltage VGND which turns on the PMOS transistors T1i, T2i through TNi. The certain fixed voltage may be the supply voltage VDD which turns off the PMOS transistors T1i, T2i through TNi.

The PMOS transistors T1i and TNi have gate terminals electrically connected to the ground voltage VGND and operate as resistors. The second PMOS transistor T2i has a gate terminal electrically connected to the supply voltage VDD and operates as an open-circuit.

A source terminal of the first PMOS transistor T1i may be electrically connected to the output node N1 of the first circuit 110. A source terminal of the second PMOS transistor T2i may be electrically connected to the output node N1 of the first circuit 110.

A source terminal of the (N)-th PMOS transistor TNi may be electrically connected to the output node N1 of the first circuit 110. A drain terminal of the first PMOS transistor T1i may be electrically connected to the input node N2 of the second circuit 120.

A drain terminal of the second PMOS transistor T2i may be electrically connected to the input node N2 of the second circuit 120. A drain terminal of the (N)-th PMOS transistor TNi may be electrically connected to the input node N2 of the second circuit 120.

In operation, the PMOS transistors T1i, T2i through TNi may decrease the activation voltage level of the first signal SIG1, which may be the same as the voltage level of the first supply voltage VDD1, to the activation voltage level of the second signal SIG2, which may be the same as the voltage level of the second supply voltage VDD2.

Figure 7C:
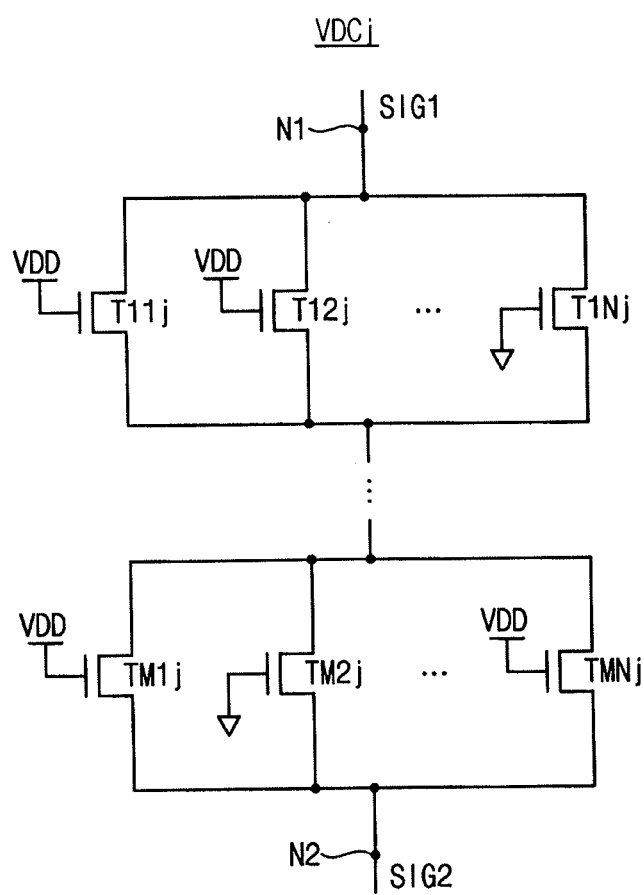

Referring to FIG. 7C, another embodiment of the voltage down converter VDCj may consist of a passive element that includes a plurality of PMOS transistors T11j, T12j through T1Nj, TM1j, TM2j through TMNj. In this case, a certain fixed voltage may be provided to gate terminals of the PMOS transistors T11j, T12j through T1Nj, TM1j, TM2j through TMNj. The certain fixed voltage may be the ground voltage VGND which turns on the PMOS transistors T11j, T12j through T1Nj, TM1j, TM2j through TMNj. The certain fixed voltage may be the supply voltage VDD which turns off the PMOS transistors T11j, T12j through T1Nj, TM1j, TM2j through TMNj.

The PMOS transistors T1Nj, TM2j have gate terminals electrically connected to the ground voltage VGND and operate as resistors. The PMOS transistors T11j, T12j, TM1j, and TM2j have gate terminals electrically connected to the supply voltage VDD and operate as open-circuits.

A source terminal of the (1, 1)-th PMOS transistor T11j may be electrically connected to the output node N1 of the first circuit 110. A source terminal of the (1, 2)-th PMOS transistor T12j may be electrically connected to the output node N1 of the first circuit 110.

A source terminal of the (1, N)-th PMOS transistor T1Nj may be electrically connected to the output node of the first circuit 110. A drain terminal of the (1, 1)-th PMOS transistor T11j, a drain terminal of the (1, 2)-th PMOS transistor T12j, and a drain terminal of the (1, N)-th PMOS transistor T1Nj may be electrically connected to a source terminal of the (2, 1)-th PMOS transistor, a source terminal of the (2, 2)-th PMOS transistor, and a source terminal of the (2, N)-th PMOS transistor.

A drain terminal of the (M−1, 1)-th PMOS transistor, a drain terminal of the (M−1, 2)-th PMOS transistor, and a drain terminal of the (M−1, N)-th PMOS transistor may be electrically connected to a source terminal of the (M, 1)-th PMOS transistor TM1j, a source terminal of the (M, 2)-th PMOS transistor TM2j, and a source terminal of the (M, N)-th PMOS transistor TMNj.

A drain terminal of the (M, 1)-th PMOS transistor TM1j may be electrically connected to the input node N2 of the second circuit 120.

A drain terminal of the (M, 2)-th PMOS transistor TM2j may be electrically connected to the input node N2 of the second circuit 120.

A drain terminal of the (M, N)-th PMOS transistor TMNj may be electrically connected to the input node N2 of the second circuit 120.

In operation, the PMOS transistors T11j, T12j through T1Nj, TM1j, TM2j through TMNj may decrease the activation voltage level of the first signal SIG1, which may be the same as the voltage level of the first supply voltage VDD1, to the activation voltage level of the second signal SIG2, which may be the same as the voltage level of the second supply voltage VDD2.

Figure 8:
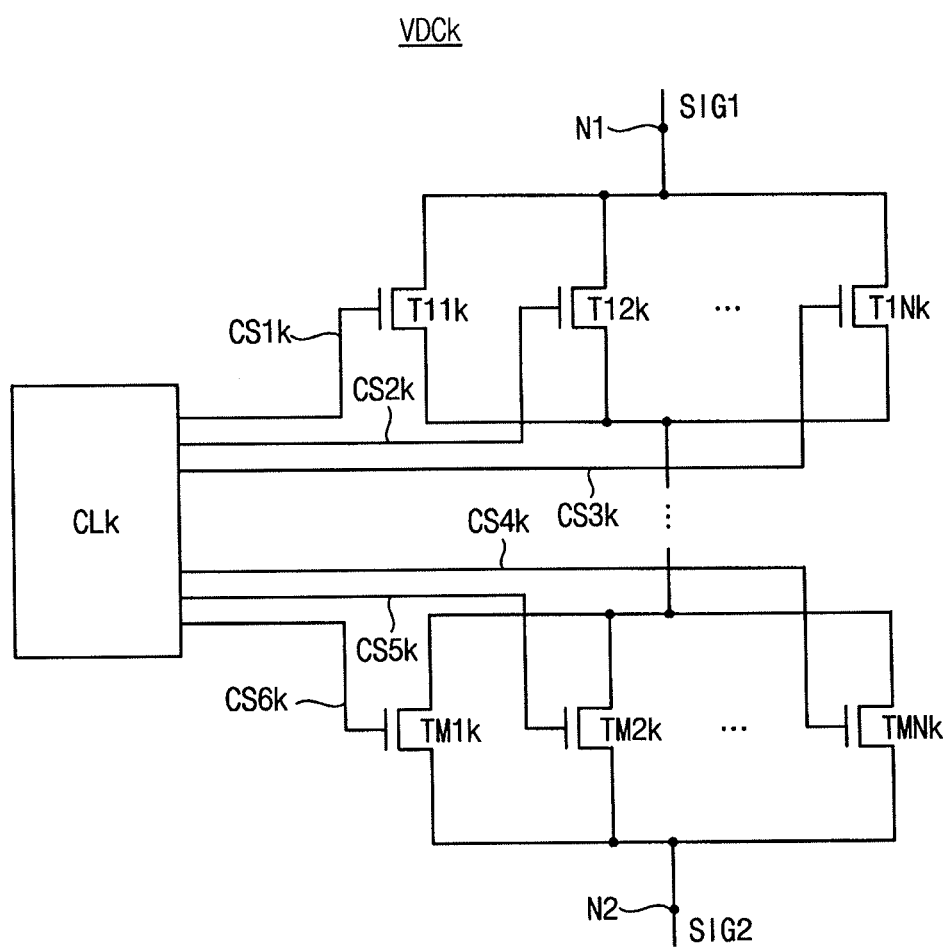

Referring to FIG. 8, another embodiment of the voltage down converter VDCk may consist of a passive element that includes a plurality of PMOS transistors T11k, T12k through T1Nk, TM1k, TM2k through TMNk, and a controller CLk. In this case, the controller CLk may provide control signals CS1k, CS2k, CS3k, CS4k, CS5k, and CS6k to gate terminals of the PMOS transistors T11k, T12k through T1Nk, TM1k, TM2k through TMNk.

The control signals CS1k, CS2k, CS3k, CS4k, CS5k, and CS6k may have the ground voltage VGND which turns on the PMOS transistors T11k, T12k through T1Nk, TM1k, TM2k through TMNk, or may have the supply voltage VDD which turns off the PMOS transistors T11k, T12k through T1Nk, TM1k, TM2k through TMNk. The control signals CS1k, CS2k, CS3k, CS4k, CS5k, and CS6k may be fixed to the supply voltage VDD or the ground voltage VGND when the phase-locked loop circuit 100 is operating.

A source terminal of the (1, 1)-th PMOS transistor T11k may be electrically connected to the output node N1 of the first circuit 110.

A source terminal of the (1, 2)-th PMOS transistor T12k may be electrically connected to the output node N1 of the first circuit 110.

A source terminal of the (1, N)-th PMOS transistor T1Nk may be electrically connected to the output node of the first circuit 110.

A drain terminal of the (1, 1)-th PMOS transistor T11k, a drain terminal of the (1, 2)-th PMOS transistor T12k, and a drain terminal of the (1, N)-th PMOS transistor T1Nk may be electrically connected to a source terminal of the (2, 1)-th PMOS transistor, a source terminal of the (2, 2)-th PMOS transistor, and a source terminal of the (2, N)-th PMOS transistor.

A drain terminal of the (M−1, 1)-th PMOS transistor, a drain terminal of the (M−1, 2)-th PMOS transistor, and a drain terminal of the (M−1, N)-th PMOS transistor may be electrically connected to a source terminal of the (M, 1)-th PMOS transistor TM1$k$, a source terminal of the (M, 2)-th PMOS transistor TM2$k$, and a source terminal of the (M, N)-th PMOS transistor TMN$k$.

A drain terminal of the (M, 1)-th PMOS transistor TM1$k$ may be electrically connected to the input node N2 of the second circuit 120.

A drain terminal of the (M, 2)-th PMOS transistor TM2$k$ may be electrically connected to the input node N2 of the second circuit 120.

A drain terminal of the (M, N)-th PMOS transistor TMN$k$ may be electrically connected to the input node N2 of the second circuit 120.

In operation, the PMOS transistors T11$k$, T12$k$ through T1N$k$, TM1$k$, TM2$k$ through TMN$k$ may decrease the activation voltage level of the first signal SIG1, which may be the same as the voltage level of the first supply voltage VDD1, to the activation voltage level of the second signal SIG2, which may be the same as the voltage level of the second supply voltage VDD2.

Figure 9:
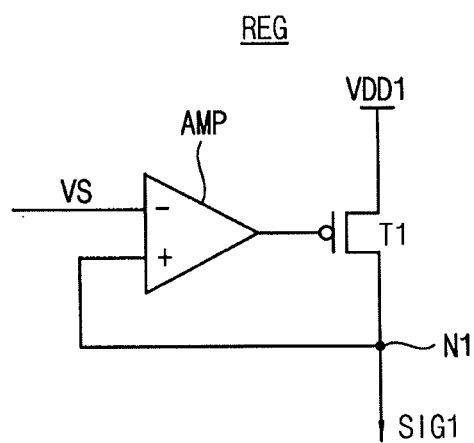
FIG. 9 illustrates an embodiment of a regulator for a phase-locked loop circuit.

FIG. 9 illustrates an embodiment of a regulator REG, which, for example, may be included in the phase-locked loop circuit of FIG. 1. Referring to FIG. 9, the regulator REG includes an operational amplifier AMP and a PMOS transistor T1. A negative input node (−) of the operational amplifier AMP receives the voltage signal VS. An output node of the operational amplifier AMP is electrically connected to a gate terminal of the PMOS transistor T1. The first supply voltage VDD1 is provided to a source terminal of the PMOS transistor T1. An output node N1 of the first circuit 110 is electrically connected to a positive input node (+) of the operational amplifier AMP and a drain terminal of the PMOS transistor T1. The first signal SIG1 is output through the output node N1 of the first circuit 110.

Figure 10:
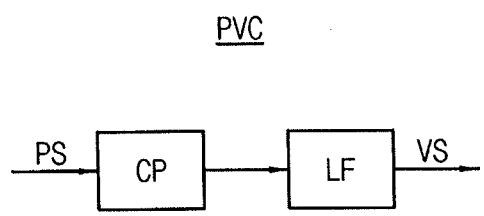
FIG. 10 illustrates an embodiment of a pulse/voltage converter.

FIG. 10 illustrates an embodiment of a pulse/voltage converter PVC, which, for example, may be included in the phase-locked loop circuit of FIG. 1. Referring to FIG. 10, the pulse/voltage converter PVC includes a loop filter LF and a charge pump CP. The loop filter LF generates the voltage signal VS based on stored charge. The charge pump CP adds charge to the stored charge or subtracts charge from the stored charge based on the pulse signal PS.

When the pulse signal PS has a positive value, the charge pump CP pushes charge corresponding to a pulse width of the pulse signal PS to the loop filter LF. The amount of the charge in a capacitor in the loop filter LF is increased, and a voltage level of the voltage signal VS is increased.

When the pulse signal PS has a negative value, the charge pump CP pulls charge corresponding to a pulse width of the pulse signal PS from the loop filter LF. The amount of the charge in the capacitor in the loop filter LF is decreased as the voltage level of the voltage signal VS is decreased.

Figure 11:
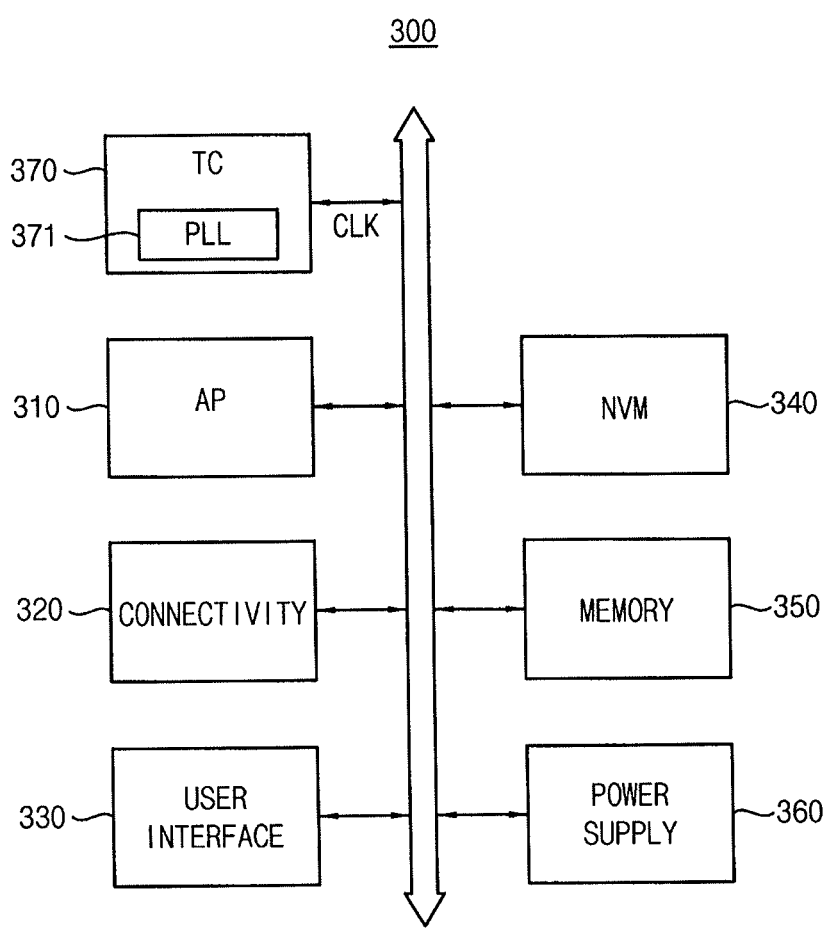
FIG. 11 illustrates an embodiment of a mobile system.

FIG. 11 illustrates an embodiment of a mobile system 300, which, for example, may include or otherwise use a phase-locked loop circuit according to any of the aforementioned embodiments.

Referring to FIG. 11, the mobile system 300 includes an application processor 310, a connectivity unit 320, a user interface 330, a nonvolatile memory device NVM 340, a memory device 350, a timing controller 370 TC, and a power supply 360. The mobile system 300 may be any one of a variety of electronic devices. Examples include but are not limited to a mobile phone, a smart phone, a personal digital assistant (PDA), a portable multimedia player (PMP), a digital camera, a music player, a portable game console, and a navigation system.

The timing circuit 370 may include a phase-locked loop circuit 371 PLL in accordance with one or more of the aforementioned embodiments. An oscillation signal of the phase-locked loop circuit 371 may be used as a clock signal CLK in the application processor 310, the connectivity unit 320, the user interface 330, the nonvolatile memory device 340, and the memory device 340.

The application processor 310 may execute various applications such as a web browser, a game application, a video player, etc. The application processor 310 may include, for example, a single core or multiple cores. Examples of multi-core processors include a dual-core processor, a quad-core processor, a hexa-core processor, etc. The application processor 810 may include an internal or external cache memory.

The connectivity unit 320 may perform wired or wireless communication with an external device. For example, the connectivity unit 320 may perform Ethernet communication, near field communication (NFC), radio frequency identification (RFID) communication, mobile telecommunication, memory card communication, universal serial bus (USB) communication, etc. The connectivity unit 320 may include, for example, a baseband chipset that supports communications, such as global system for mobile communications (GSM), general packet radio service (GPRS), wideband code division multiple access (WCDMA), high speed downlink/uplink packet access (HSxPA), etc.

The memory device 350 may store data processed by the application processor 310 or may operate as a working memory. Each of memory cells in the memory device 350 may include, for example, a write transistor, a read transistor, and a metal oxide semiconductor (MOS) capacitor. The write transistor may include a gate electrode coupled to a write word line, a first electrode coupled to a write bit line, and a second electrode coupled to a storage node.

The read transistor may include a gate electrode coupled to the storage node, a first electrode coupled to a read word line, and a second electrode coupled to a read bit line.

The MOS capacitor may include a gate electrode coupled to the storage node and a lower electrode coupled to a synchronization control line. A synchronization pulse signal may be applied to the lower electrode of the MOS capacitor in synchronization with a write word line signal in a write operation, and may be applied to the lower electrode of the MOS capacitor in synchronization with a read word line signal in a read operation. As a result, a coupling effect may occur at the storage node through the MOS capacitor in response to the synchronization pulse signal.

Therefore, a data retention time of the memory cell included in the memory device 350 may increase. In one embodiment, the memory device 350 may have a longer data retention time than a dynamic random access memory (DRAM) and a higher density than a static random access memory (SRAM).

The nonvolatile memory device 340 may store a boot image for booting the mobile system 300. For example, the nonvolatile memory device 340 may be an electrically erasable programmable read-only memory (EEPROM), a flash memory, a phase change random access memory (PRAM), a resistance random access memory (RRAM), a nano floating gate memory (NFGM), a polymer random access memory (PoRAM), a magnetic random access memory (MRAM), a ferroelectric random access memory (FRAM), etc.

The user interface 330 may include at least one input device such as a keypad, a touch screen, etc., and at least one output device, such as a speaker, a display device, etc. The power supply 360 may supply a power supply voltage to the mobile system 300.

The mobile system 300 may further include an image processor, and/or a storage device, such as a memory card, a solid state drive (SSD), a hard disk drive (HDD), a CD-ROM, etc.

The mobile system 300 and/or components of the mobile system 300 may be packaged in various forms such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline IC (SOIC), shrink small outline package (SSOP), thin small outline package (TSOP), system in package (SIP), multi chip package (MCP), wafer-level fabricated package (WFP), or wafer-level processed stack package (WSP).

FIG. 12 illustrates an embodiment of a computing system 400 which includes a processor 410, an input/output hub (IOH) 420, an input/output controller hub (ICH) 430, at least one memory module 440, a timing circuit 460 TC, and a graphics card 450. The computing system 400 may be any one of a variety of electronic devices, including but not limited to a personal computer (PC), a server computer, a workstation, a laptop computer, a mobile phone, a smart phone, a personal digital assistant (PDA), a portable multimedia player (PMP), a digital camera), a digital television, a set-top box, a music player, a portable game console, a navigation system, etc.

The timing circuit 460 may include a phase-locked loop circuit 461 PLL in accordance with any of the aforementioned embodiments. An oscillation signal of the phase-locked loop circuit 461 may be used as a clock signal CLK in the processor 410, the input/output hub (IOH) 420, the input/output controller hub (ICH) 430, at least one memory module 440, and the graphics card 450.

The processor 410 may perform various computing functions such as executing specific software for performing specific calculations or tasks. For example, the processor 410 may be a microprocessor, a central process unit (CPU), a digital signal processor, or the like.

The processor 410 may include, for example, a single core or multiple cores. Examples of a multi-core processor include a dual-core processor, a quad-core processor, a hexa-core processor, etc. Although FIG. 12 illustrates that the computing system 400 has one processor 410, the computing system 400 may include a plurality of processors in an another embodiment.

The processor 410 may include a memory controller for controlling operations of the memory module 440. The memory controller may be, for example, an integrated memory controller (IMC). A memory interface between the memory controller and the memory module 440 may be implemented with a single channel including a plurality of signal lines, or may be implemented with multiple channels. At least one memory module 440 may be coupled to each of the multiple channels. The memory controller may be located, for example, inside the input/output hub 420. The input/output hub 420 including the memory controller may be referred to as memory controller hub (MCH).

The memory module 440 may include a plurality of memory devices MEM 441 that store data provided from the memory controller. Each of memory cells in the memory device 441 may include a write transistor, a read transistor, and a metal oxide semiconductor (MOS) capacitor.

The write transistor may include a gate electrode coupled to a write word line, a first electrode coupled to a write bit line, and a second electrode coupled to a storage node.

The read transistor may include a gate electrode coupled to the storage node, a first electrode coupled to a read word line, and a second electrode coupled to a read bit line.

The MOS capacitor may include a gate electrode coupled to the storage node and a lower electrode coupled to a synchronization control line. A synchronization pulse signal may be applied to the lower electrode of the MOS capacitor in synchronization with a write word line signal in a write operation, and may be applied to the lower electrode of the MOS capacitor in synchronization with a read word line signal in a read operation. As a result, a coupling effect may occur at the storage node through the MOS capacitor in response to the synchronization pulse signal.

Therefore, a data retention time of the memory cell in the memory device 441 may increase. In one embodiment, the memory device 441 may have a longer data retention time than a dynamic random access memory (DRAM) and a higher density than a static random access memory (SRAM).

The input/output hub 420 may manage data transfer between processor 410 and devices such as the graphics card 450. The input/output hub 420 may be coupled to the processor 410 via various interfaces. For example, the interface between the processor 410 and the input/output hub 420 may be a front side bus (FSB), a system bus, a HyperTransport, a lightning data transport (LDT), a QuickPath interconnect (QPI), a common system interface (CSI), etc. The input/output hub 920 may provide various interfaces with the devices. For example, the input/output hub 420 may provide an accelerated graphics port (AGP) interface, a peripheral component interface-express (PCIe), a communications streaming architecture (CSA) interface, etc. Although FIG. 12 illustrates the computing system 400 including one input/output hub 420, in some embodiments, the computing system 400 may include a plurality of input/output hubs.

The graphics card 450 may be coupled to the input/output hub 420 via AGP or PCIe. The graphics card 450 may control a display device for displaying an image. The graphics card 450 may include an internal processor for processing image data and an internal memory device. The input/output hub 420 may include an internal graphics device along with or instead of the graphics card 450 outside the graphics card 450. The graphics device included in the input/output hub 420 may be referred to as integrated graphics. Further, the input/output hub 420 may include an internal memory controller and an internal graphics device, which may be referred to as a graphics and memory controller hub (GMCH).

The input/output controller hub 430 may perform data buffering and interface arbitration to efficiently operate various system interfaces. The input/output controller hub 430 may be coupled to the input/output hub 420 via an internal bus, such as a direct media interface (DMI), a hub interface, an enterprise Southbridge interface (ESI), PCIe, etc.

The input/output controller hub 430 may provide various interfaces with peripheral devices. For example, the input/output controller hub 430 may provide a universal serial bus (USB) port, a serial advanced technology attachment (SATA) port, a general purpose input/output (GPIO), a low pin count (LPC) bus, a serial peripheral interface (SPI), PCI, PCIe, etc.

The processor 410, the input/output hub 420 and the input/output controller hub 430 may be implemented as separate chipsets or separate integrated circuits. At least two of the processor 410, the input/output hub 420, or the input/output controller hub 430 may be implemented as a single chipset.

In accordance with one or more embodiments, a phase-locked loop circuit includes a voltage down converter which includes a passive circuit which transfers a signal from a first circuit, operating based on a relatively high supply voltage, to a second circuit, operating based on a relatively low supply voltage, based on an IR voltage drop of a resistance of the passive circuit without additional active element.

In accordance with another embodiment, a phase-locked loop circuit includes a voltage down converter which includes a passive circuit which may reduce a jitter of an input signal to be supplied to a VCO delay cell, and which may reduce a gain KVCO of the VCO delay cell. The phase-locked loop circuit may be implemented in a relatively small area, because the voltage down converter includes a passive circuit and does not include an active circuit.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, it will be understood by those of skill in the art that various changes in form and details may be made without departing from the spirit and scope of the present invention as set forth in the following claims.

What is claimed is:

1. A phase-locked loop circuit, comprising:
   a first circuit to generate a first signal based on a reference signal and a feedback signal, the first circuit to operate based on a first supply voltage;
   a second circuit to generate an oscillation signal based on a second signal and to generate the feedback signal by dividing the oscillation signal, the second circuit to operate based on a second supply voltage lower than the first supply voltage; and
   a voltage down converter to generate the second signal by decreasing an activation voltage level of the first signal, wherein the voltage down converter includes at least one passive element electrically connected between the first circuit and the second circuit, wherein the second circuit includes:
   an oscillator to generate the oscillation signal based on the second signal, which is received through an input node of the second circuit; and
   a divider to generate the feedback signal by dividing the oscillation signal.

2. The circuit as claimed in claim 1, wherein the at least one passive element is a resistor.

3. The circuit as claimed in claim 1, wherein the at least one passive element includes one or more transistors having gate terminals that receive a fixed voltage.

4. The circuit as claimed in claim 3, wherein the one or more transistors are connected in series between an output node of the first circuit and an input node of the second circuit.

5. The circuit as claimed in claim 3, wherein the one or more transistors are connected in parallel between an output node of the first circuit and an input node of the second circuit.

6. The circuit as claimed in claim 1, wherein the at least one passive element includes a plurality of transistors, voltage levels of gate terminals of the transistors being controlled so that an activation voltage level of the second signal is substantially equal to a voltage level of the second supply voltage.

7. The circuit as claimed in claim 6, wherein the voltage down converter further includes a controller to generate control signals for the controlling voltage levels of the gate terminals of the transistors.

8. The circuit as claimed in claim 1, wherein the first circuit includes:
   a voltage up converter to generate an increased reference signal and an increased feedback signal, by increasing activation voltage levels of the reference signal and the feedback signal;
   a phase/frequency detector to generate a pulse signal based on a comparison of the increased reference signal and the increased feedback signal;
   a pulse/voltage converter to generate a voltage signal corresponding to the pulse signal; and
   a regulator to generate the first signal having a regulated activation voltage level by regulating the voltage signal.

9. The circuit as claimed in claim 8, wherein the pulse/voltage converter includes:
   a loop filter to generate the voltage signal based on stored charge; and
   a charge pump to add charge to the stored charge or subtract charge from the stored charge based on the pulse signal.

10. The circuit as claimed in claim 8, wherein the regulator includes:
    a transistor; and
    an operational amplifier,
    wherein a negative input node of the operational amplifier is to receive the voltage signal, an output node of the operational amplifier is electrically connected to a gate terminal of the transistor, the first supply voltage is to be provided to a source terminal of the transistor, an output node of the first circuit is electrically connected to a positive input node of the operational amplifier and a drain terminal of the transistor, and the first signal is to be output through the output node of the first circuit.

11. The circuit as claimed in claim 8, wherein the voltage up converter includes a level shifter.

12. A phase-locked loop circuit, comprising:
    a first circuit including:
       a voltage up converter to generate an increased reference signal and an increased feedback signal by increasing activation voltage levels of a reference signal and a feedback signal;
       a phase/frequency detector to generate a pulse signal based on a comparison of the increased reference signal and the increased feedback signal;
       a pulse/voltage converter to generate a voltage signal based on the pulse signal; and a regulator to generate a first signal having a regulated activation voltage level by regulating the voltage signal;
a second circuit including:
an oscillator to generate an oscillation signal based on a second signal; and
a divider to generate the feedback signal by dividing the oscillation signal; and
a voltage down converter to generate the second signal by decreasing the regulated activation voltage level of the first signal, wherein the voltage down converter includes a passive element electrically connected between the first circuit and the second circuit, and wherein the first circuit operates based on a first supply voltage and the second circuit operates based on a second supply voltage lower than the first supply voltage.

13. A phase-locked loop circuit, comprising:
a first circuit to generate a first signal based on a comparison between a reference signal and a feedback signal;
a second circuit to generate the feedback signal based on the first signal; and
a passive circuit between first and second circuits, wherein the passive circuit is to decrease an activation voltage level of the first signal, and wherein the first and second circuits operate based different power supply voltages, wherein the first circuit is coupled to the second circuit through the passive circuit, and wherein an active circuit is not coupled along a signal path along which the first signal is carried between the first and second circuits.

14. The circuit as claimed in claim 13, wherein:
the first circuit is to operate based on a first power supply voltage, and
the second circuit is to operate based on a second power supply voltage less than the first power supply voltage.

15. The circuit as claimed in claim 14, wherein:
the activation voltage level of the first signal is substantially equal to the first power supply voltage, and
the passive circuit is to decrease the activation voltage level of the first signal to an activation voltage level which corresponds to second power supply voltage.

16. The circuit as claimed in claim 13, wherein a signal output from the passive circuit has a voltage based on a resistance of the passive circuit.

17. The circuit as claimed in claim 13, wherein the passive circuit includes at least one three-terminal device operating in a passive mode.

18. The circuit as claimed in claim 13, wherein the second circuit includes a voltage-controlled oscillator delay cell to output an oscillation signal based on a signal output from the passive circuit.

* * * * *